United States Patent

Mugiya

[11] Patent Number: 5,940,964
[45] Date of Patent: Aug. 24, 1999

[54] FABRICATION PROCESS FOR CIRCUIT SUBSTRATE HAVING INTERCONNECTION LEADS

[75] Inventor: Hiroshi Mugiya, Kawasaki, Japan

[73] Assignee: Fujitsu Limited, Kawasaki, Japan

[21] Appl. No.: 08/874,668

[22] Filed: Jun. 13, 1997

Related U.S. Application Data

[62] Division of application No. 08/545,256, Oct. 19, 1995, Pat. No. 5,671,531.

[30] Foreign Application Priority Data

Mar. 17, 1995 [JP] Japan .................................. 7-058574

[51] Int. Cl.$^6$ ..................................................... H05K 3/34
[52] U.S. Cl. .................... 29/840; 29/825; 29/830; 174/280; 174/262
[58] Field of Search ................ 29/832, 840, 852, 29/600, 843, 825, 830; 174/250, 262

[56] References Cited

U.S. PATENT DOCUMENTS

| | | |
|---|---|---|
| 3,780,431 | 12/1973 | Feeney . |
| 4,316,320 | 2/1982 | Nogawa et al. . |
| 4,343,083 | 8/1982 | Takamura et al. . |
| 4,343,084 | 8/1982 | Wilmarth . |
| 4,426,773 | 1/1984 | Hargis . |
| 4,641,112 | 2/1987 | Kohayakawa . |
| 4,980,219 | 12/1990 | Hiraide et al. . |
| 5,031,073 | 7/1991 | Chang . |
| 5,341,274 | 8/1994 | Nakatami et al. . |
| 5,424,633 | 6/1995 | Soiferman . |
| 5,449,863 | 9/1995 | Nakatani et al. . |
| 5,512,710 | 4/1996 | Schroeder . |
| 5,517,110 | 5/1996 | Soiferman . |

FOREIGN PATENT DOCUMENTS

| | | |
|---|---|---|
| 0287111 A2 | 10/1988 | European Pat. Off. . |
| 3925814 A1 | 2/1991 | Germany . |
| 57-190339 | 11/1982 | Japan . |
| 1-165196 | 6/1989 | Japan . |
| 3-1470 | 1/1991 | Japan . |
| 4-359463 | 12/1992 | Japan . |
| 7-45774 | 2/1995 | Japan . |
| 95-10046 | 4/1995 | Rep. of Korea . |

Primary Examiner—Carl J. Arbes
Attorney, Agent, or Firm—Staas & Halsey

[57] ABSTRACT

A method for manufacturing an apparatus includes the steps of forming a plurality of circuit regions on a single master print circuit board, soldering one or more interconnection leads upon corresponding pad electrodes of the foregoing circuit regions, in a state that the plurality of circuit regions are connected with each other mechanically to form the master print circuit board, and dividing the master print circuit board into individual printed circuit boards each corresponding to one of the circuit regions on the master print circuit board.

8 Claims, 9 Drawing Sheets

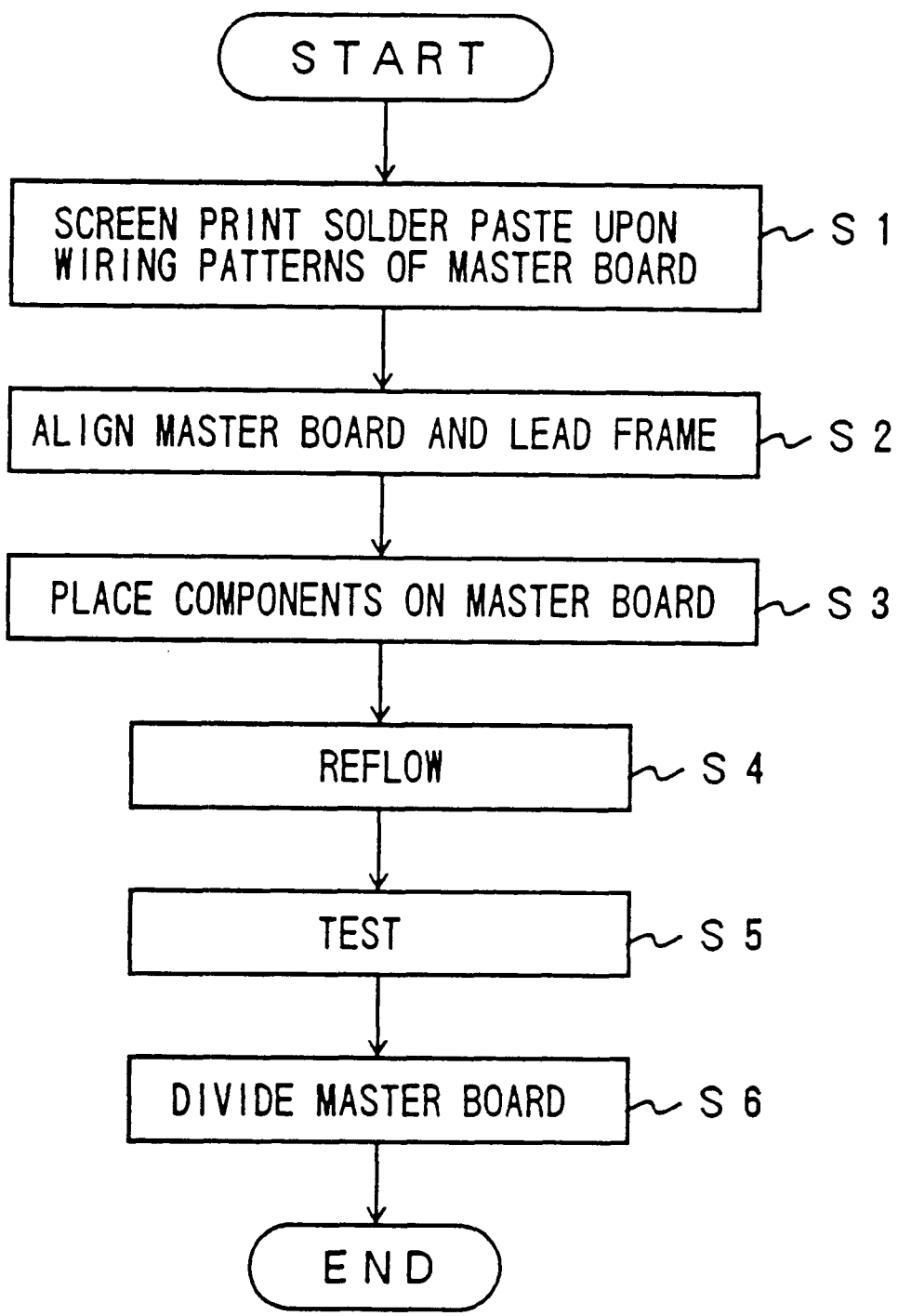

FIG. II
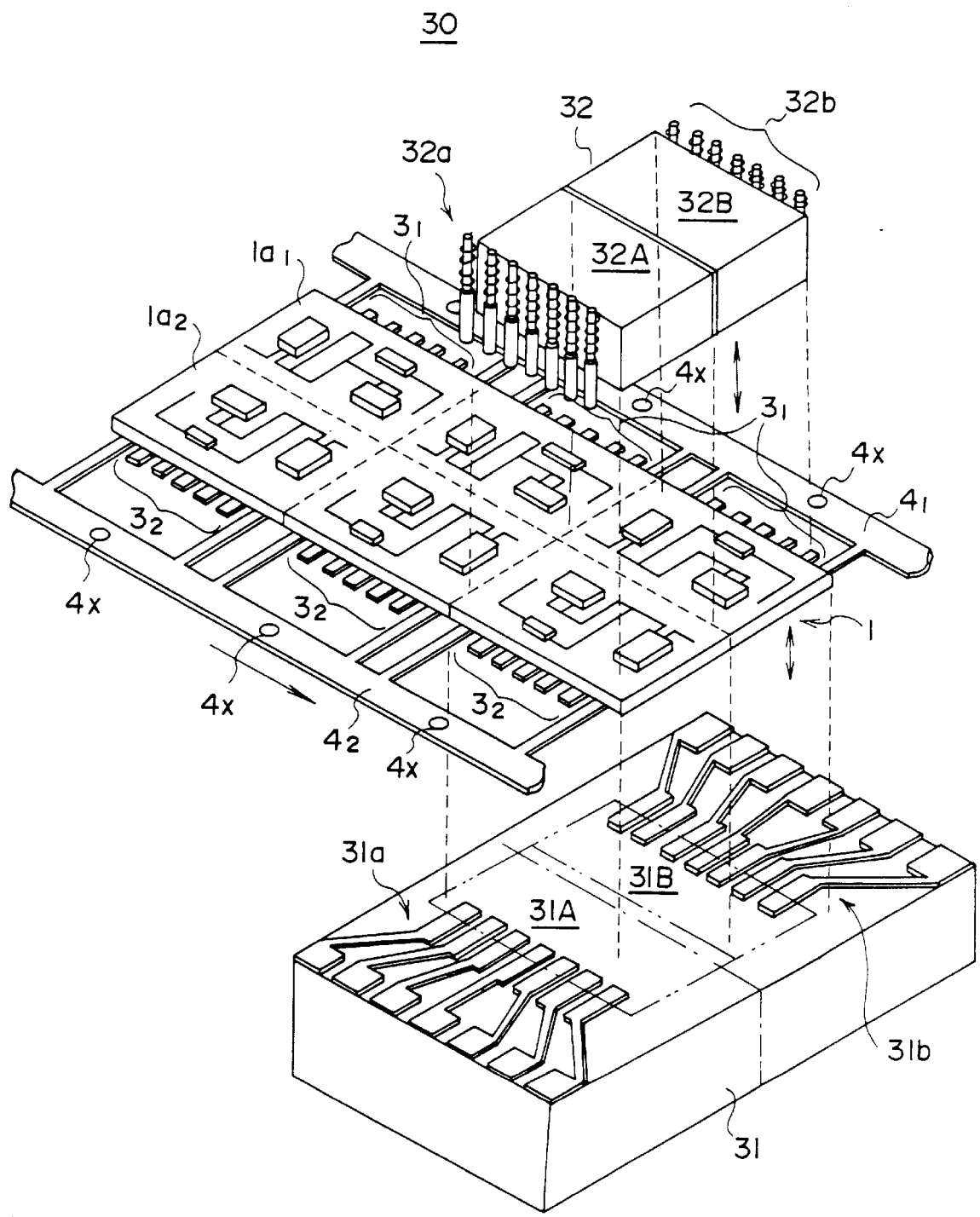

FABRICATION PROCESS FOR CIRCUIT SUBSTRATE HAVING INTERCONNECTION LEADS

This application is a division of application Ser. No. 08/545,256, filed Oct. 19, 1995, now U.S. Pat. No. 5,671,531.

BACKGROUND OF THE INVENTION

The present invention generally relates to electronic apparatuses, and more particularly to manufacturing of such an apparatus having a substrate on which a wiring pattern is formed and one or more electric or electronic components are mounted.

Electronic apparatuses including those for microwave applications generally include various components such as capacitors, resistors, transistors and integrated circuits mounted upon a common print circuit board.

When producing such electronic apparatuses in large numbers, a number of identical print circuit boards are formed such that the print circuit boards carry identical circuit patterns thereon, and components such as capacitors, resistors, transistors or integrated circuits are mounted thereon in contact with the corresponding circuit patterns. Further, by passing the print circuit board through a reflowing furnace together with the components thereon, the solder paste that has been screen-printed on the circuit patterns causes a reflowing, and the components are soldered firmly upon the corresponding circuit patterns. Further, interconnection leads are provided on the print circuit board in connection with various input and output electrode pads as well as in connection with various power electrode pads and ground pads. In the recent semiconductor circuits where the components are mounted with high mounting density, the print circuit board may further be provided with a heat sink for dissipating heat produced by the components.

In order to produce such electronic apparatuses in large numbers and with high throughput of production, it is proposed to mount the interconnection leads on the print circuit boards in a state such that the interconnection leads are formed on a common lead frame as an integral part thereof. The lead frame may include a heat sink also as a part thereof.

FIGS. 1A and 1B show such a conventional process for mounting interconnection leads 13 upon print circuit boards 11a–11n, wherein FIG. 1A shows the top side of the print circuit boards 11a–11n while FIG. 1B shows bottom side thereof.

Referring to FIGS. 1A and 1B, each of the print circuit boards 11a–11n carry thereon a wiring pattern 11w, and the interconnection leads 13 are held on a common lead frame 14 as a part thereof. Further, the lead frame 14 includes heat sinks 12a–12n respectively in correspondence to the print circuit boards 11a–11n. Although not illustrated explicitly, the heat sinks 12a–12n are connected to the lead frame 14 as a part thereof by a bridging part. As usual, the wiring patterns 11w are coated with a solder paste, which may be applied by screen-printing process, or the like.

In the process of FIGS. 1A and 1B, it should be noted that the print circuit boards 11a–11n are mounted upon the respective heat sinks 12a–12n in alignment with the lead frame 14 such that interconnection pads formed on the print circuit boards 11a–11n establish a contact engagement with corresponding interconnection leads 13. After the alignment is archived as such, the lead frame 14 and the print circuit boards 11a–11n thereon are passed through a reflowing furnace to achieve a soldering of the interconnection leads 13 upon the corresponding interconnection pads of the print circuit boards 11a–11n.

After the print circuit boards 11a–11n are thus connected firmly upon the lead frame 14 by way of the interconnection leads 13, electric and/or electronic components such as resistors, capacitors, transistors, integrated circuits, and the like, are mounted upon respective parts of the conductor patterns 11w on the print circuit boards 11a–11n, by a robot or other suitable automatic assembling apparatus. As the same assembling procedure is repeated in each of the print circuit boards 11a–11n, the assembling process of FIGS. 1A and 4B is particularly suitable for automatic assembling conducted at high throughput.

The process of FIGS. 1A and 1B, however, has a drawback in that the alignment between the print circuit boards 11a–11n and the interconnection leads 13 on the lead frame 14 may be lost at the time of reflowing of the solder alloy as indicated in FIG. 2.

Referring to FIG. 2, it will be noted that the print circuit board 11a is rotated with respect to the lead frame 14 and hence the interconnection leads 13, while the print circuit boards 11b and 11n are translated parallel with respect to the lead frame 14. In such a case, while the electrical connection between the interconnection leads 13 and the corresponding interconnection pads on the print circuit boards 11a–11n may be maintained, the mounting of the electric and/or electronic components upon the print circuit boards in exact alignment with the wiring patterns 11w thereon becomes difficult. It should be noted that the print circuit boards 11a–11n carry very fine conductor patterns for the wiring patterns 11w for increased mounting density of the components thereon. When the amount of displacement of drifting of the print circuit boards 11a–11n is excessive, even the electrical connection between the interconnection leads 13 and the corresponding pads would no longer be maintained.

Conventionally, therefore, it has been necessary to measure the deviation of each of the print circuit boards 11a–11n accurately by a sensor provided on the robot and to correct the deviation such that the electronic components are properly mounted upon the displaced print circuit boards. However, such a process of detecting and correcting the deviation requires time even when a fully automated assembling apparatus is used, and the throughput of production of the electronic apparatus is inevitably deteriorated.

Alternatively, one may first mount the components on each of the print circuit boards 11a–11n with high precision, followed by mounting each of the print circuit boards 11a–11n on the lead frame 14. Thereby, it is expected that the error between the components and the wiring patterns on the print circuit board is minimized, even if the relative positioning between the interconnection leads 13, and hence the lead frame 14, and the print circuit boards 11a–11n is deteriorated as in the case of FIG. 2.

On the other hand, such a conventional process has a drawback in that the solder alloy on the print circuit board causes a reflowing at the time of mounting the interconnection leads 13 on the print circuit boards 11a–11n, and the components already soldered upon the print circuit boards in exact alignment may experience an unwanted drifting as a result. When such a drifting occurs, the alignment between the components and corresponding wiring patterns 11w on the print circuit may be lost.

In order to avoid such a drifting of the components on the print circuit board, it is necessary to use a different solder alloy composition having a lower melting temperature for the second time soldering process and to carry out the second time soldering at a lower temperature, while use of such additional solder alloy composition or lower temperature furnace for reflowing inevitably increases the cost of the product.

SUMMARY OF THE INVENTION

Accordingly, it is a general object of the present invention to provide a novel and useful process for producing an electronic apparatus wherein the foregoing problems are eliminated.

Another and more specific object of the present invention is to provide a method for producing an apparatus having a print circuit board with high throughput.

Another object of the present invention is to provide a method for producing an apparatus that includes a print circuit board, said method comprising the steps of:

(a) forming a plurality of circuit regions on a single master print circuit board such that each of said plurality of circuit regions includes a conductor pattern that corresponds to a print circuit board forming said apparatus;

(b) connecting one or more interconnection leads upon corresponding pad electrodes in each of said circuit regions in a state that said plurality of circuit regions are connected with each other mechanically in the form of said master print circuit board; and (c) dividing said master print circuit board, after said step (b), into individual printed circuit boards each corresponding to one of said circuit regions on said master print circuit board.

Another object of the present invention is to provide a circuit board assembly as claimed in claim 8, wherein said master print circuit board has a first edge and a second, opposing edge, said plurality of print circuit regions including first group circuit regions disposed along said first edge and second group circuit regions disposed along said second edge, and wherein said lead frame structure comprises a first lead frame member and a second lead frame member each including said lead frame and said plurality of interconnection leads, said first lead frame member being disposed along said first edge of said master print circuit board such that said interconnection leads are connected to respective, corresponding electrode pads in said first group circuit regions, said second lead frame member being disposed along said second edge of said master print circuit board along said second edge of said master print circuit board such that said interconnection leads are connected to respective, corresponding electrode pads in said of second group circuit regions.

According to the present invention, soldering of the interconnection leads upon the print circuits is conducted in the state that the plurality of print circuit regions are connected with each other with rigidity. The lead frame structure, in turn, also includes the foregoing lead frame regions in a state that the lead frame regions are connected with each other with rigidity. Thereby, once a proper positioning is achieved between the lead frame structure and the master print circuit board, the alignment between the interconnection leads and the pad electrodes on the print circuit board is easily maintained throughout the plurality of print circuit regions and the lead frame regions, even when the reflowing process of the solder alloy is conducted.

In a preferred embodiment of the present invention, the soldering of electronic components is conducted upon the print circuit regions concurrently to the soldering of the interconnection leads. As each of the print circuit regions is free from drift at the time of soldering, one can achieve high precision alignment between the electronic components and the corresponding conductor patterns on the print circuit regions, while maintaining a high throughput of production.

After the electronic components are thus mounted, the master print circuit board is divided into a plurality of print circuit boards either by breaking the master print circuit board mechanically or by dicing the same by a sawing machine.

Other objects and further features of the present invention will become apparent from the following detailed description when read in conjunction with the attached drawings.

BRIEF DESCRIPTION OF THE DRAWINGS

FIG. 4 is a flowchart showing the production process according to the first embodiment;

FIG. 11 is a diagram showing the construction of another test rig used for testing the apparatus in the state of half-product.

DETAILED DESCRIPTION OF THE PREFERRED EMBODIMENTS

Figure 3A:
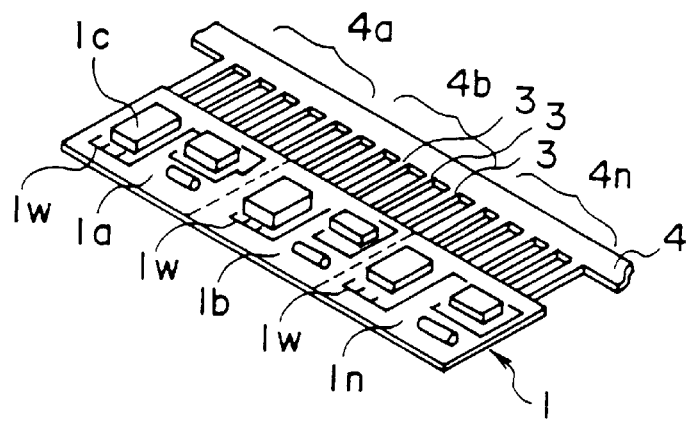
FIGS. 3A and 3B are diagrams showing a first embodiment of the present invention.
Figure 3B:
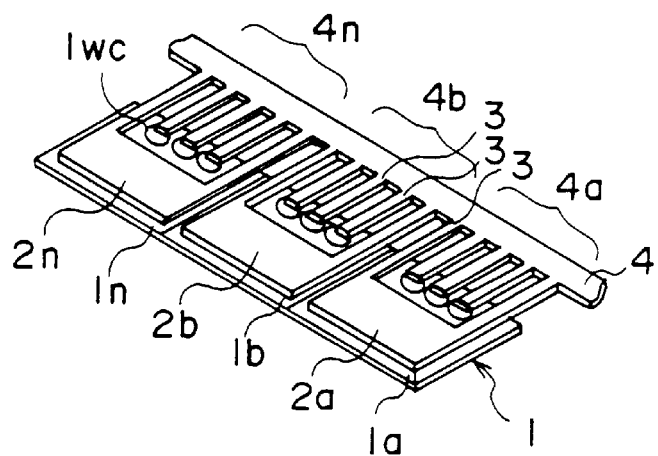

FIGS. 3A and 3B show the process for producing an electronic apparatus in the stage of a half-product, wherein FIG. 3A shows the top side of the half-product in a perspective view while FIG. 3B shows the bottom side of the half-product also in a perspective view. It should be noted that the illustrated process produces a semiconductor package as the electronic apparatus.

Referring to FIG. 3A, the half-product includes a master print circuit board 1 on which a number of print circuit regions 1a–1n are defined, wherein it will be noted that each of the print circuit regions 1a–1n includes a wiring pattern 1w and electronic components 1c, which may be a resistor, a capacitor, a transistor or an integrated circuit. Further, as can be seen in FIG. 3B, heat sink plates 2a, 2b and 2n are provided on the bottom side of the master print circuit board 1 respectively in correspondence to the regions 1a–1n, wherein the heat sink plates 2a, 2b and 2n are formed as a unitary, integral body of the lead frame 4.

The lead frame 4, in turn, includes a plurality of lead frame regions 4a–4n, wherein the region 4a corresponds to the region 1a, the region 4b corresponds to the region 1b, and the region 4n corresponds to the region 1n. In each of the regions 4a–4n, one or more interconnection leads 3 are provided so as to extend from the lead frame 4 as a unitary, integral part thereof. In the half-product of FIGS. 3A and 3B, each of the interconnection leads 3 is soldered upon a corresponding electrode pad 1wc, which is formed on the bottom side of the master print circuit board 1 in electrical connection with the wiring pattern 1w in each of the regions 1a–1n.

FIG. 4 shows the process for preparing the half-product of FIGS. 3A and 3B.

Referring to FIG. 4, a solder paste is applied upon the wiring pattern 1w in each of the regions 1a–1n of the master print circuit board 1 in a step S1, by a screen printing process or any other suitable process.

After the step S1, the master print circuit board 1 thus applied with the solder paste is aligned with respect to the lead frame 4 in a step S2, such that the circuit board 1 is supported upon the heat sink plates 2a–2n and such that each of the interconnection leads 3 of the lead frame 4 contacts with a corresponding electrode pad 1wc.

Next, while maintaining alignment between the master print circuit board 1 and the lead frame 4, the electronic components 1c are placed in a step S3 upon the master print circuit board 1 at respective predetermined locations with high precision. Such a placement of the electronic components 1c may be conducted by a robot or other suitable automated assembling facility.

After the step S3, the master print circuit board 1 carrying thereon the electronic components 1c and the lead frame 4 are passed through a reflowing furnace in a step S4 so as to cause a reflowing in the solder paste applied upon the wiring patterns 1c on the master print circuit board 1. Simultaneously, the heat sink plates 2a–2n are soldered upon the master print circuit board 1.

Further, in a step S5, the lead frame 4 is cut such that the interconnection leads 3 are separated from each other, and the individual print circuits thus formed are tested in the state that they are still on the common master print circuit board 1. After testing, each of the print circuit regions 1a–1n are provided with an electromagnetic shield cap.

Finally, in a step S6, the master print circuit board 1 is divided into individual print circuit boards corresponding to the regions 1a–1n. In the step of S6, one may provide an electromagnetic shield cap upon each of the print circuit regions 1a–1n while in the state that the print circuit regions 1a–1n are connected with each other on the master print circuit board 1.

Figure 1A:
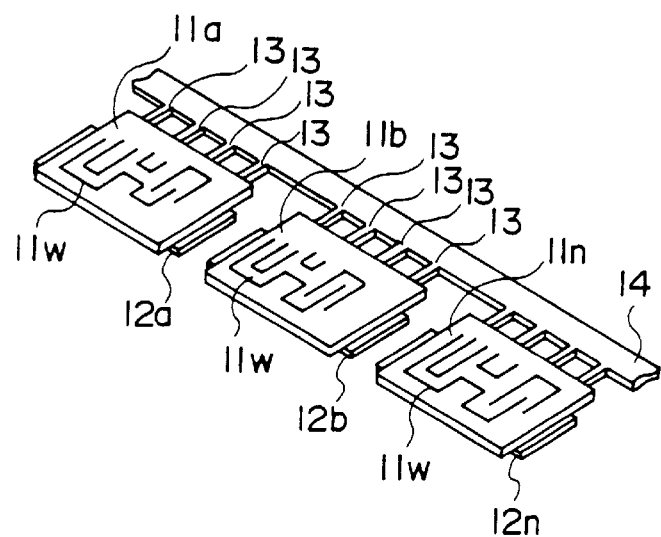
FIGS. 1A and 1B are diagrams showing conventional process for producing electronic apparatuses that includes a print circuit board.
Figure 1B:
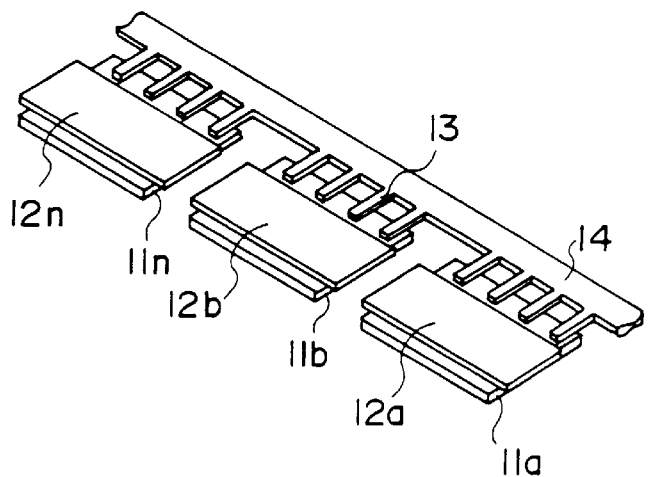
Figure 2:
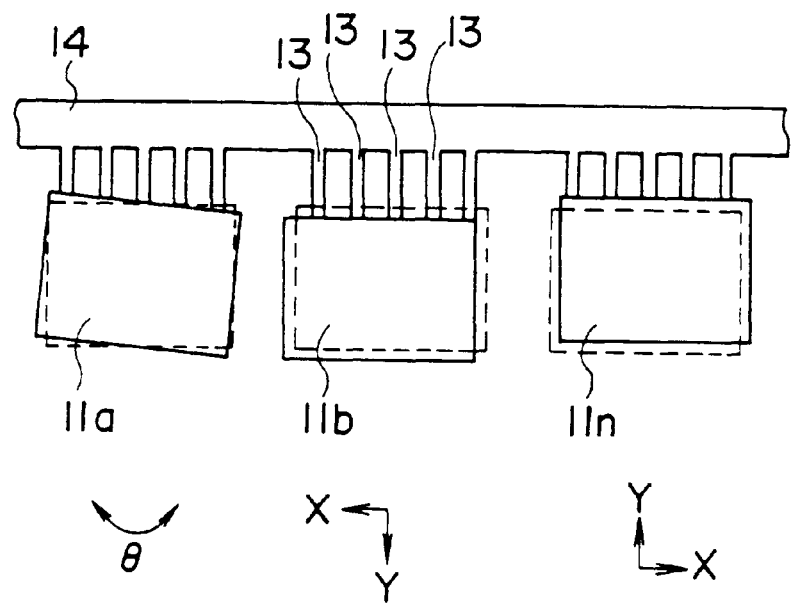
FIG. 2 is a diagram showing the problems encountered in the conventional production process.
Figure 5:
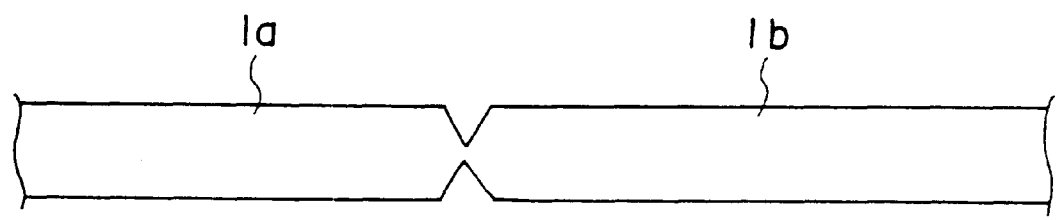
FIG. 5 is a diagram showing a groove provided on a master print circuit board for facilitating the dicing process thereof.

According to the process of FIG. 4, the alignment between the components 1c and the corresponding wiring patterns 1w on the master print circuit board 1 is maintained easily at the time of reflowing in the step S4, as the reflowing process is carried out in the state that the print circuit regions 1a–1n are connected rigidly with each other. For example, the master print circuit board 1 and the lead frame 4 may be clamped with each other by a clip at tow or three locations In the step S5 of FIG. 4, one may saw the master print circuit board 1 by a diamond dicing saw or a laser saw. Alternatively, it is possible to form a V-shaped groove along the boundary between the regions 1a–1n as indicated in FIG. 5, and break the master print circuit board 1 at the V-shaped groove, wherein the V-shaped groove corresponds to the broken line shown in FIG. 3A.

It should be noted that the lead frame 4, the interconnection leads 3, and the heat sink plates 2a–2n, have the same, common composition and may be formed of any of a Fe—Ni—Co alloy ("Covar"), Fe—Ni alloy ("42 alloy"), or a Fe-alloy. The lead frame 4 may have a thickness of 0.1–0.5 mm throughout the interconnection leads 13 and the heat sink plates 2a–2n. Thereby, the lead frame 4, the interconnection leads 3 and the heat sink plates 2a–2n form a common, flush surface, and automated assembling of the print circuit board and hence the electronic apparatus is substantially facilitated on such a flush surface. Thus, the assembling process of the present invention is particularly suitable for producing electronic substrates having improved heat dissipation.

In the description heretofore, the print circuit board 1 also includes a print circuit board that has a ceramic substrate. When a ceramic substrate is used, the print circuit board 1 may have a thickness of 0.2–0.8 mm.

Figure 6A:
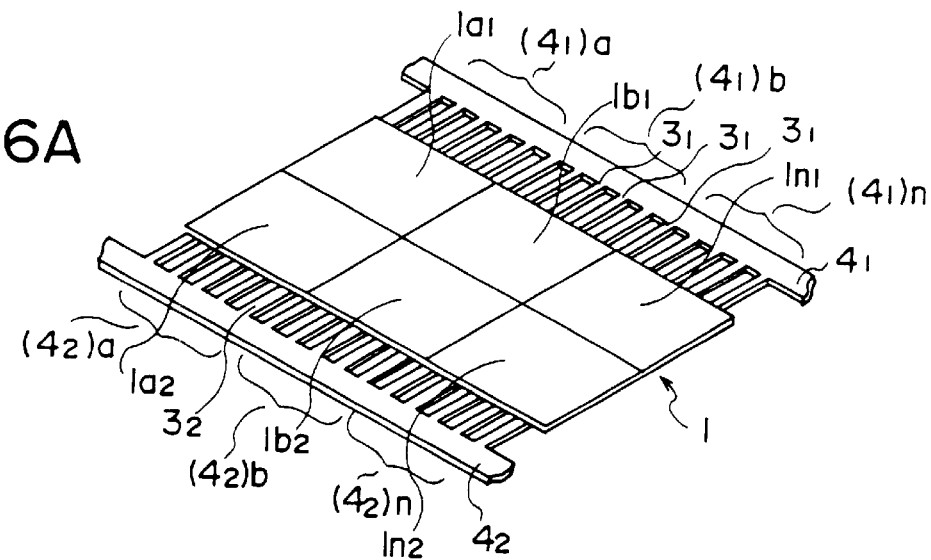
FIGS. 6A and 6B are diagrams showing a second embodiment of the present invention.
Figure 6B:
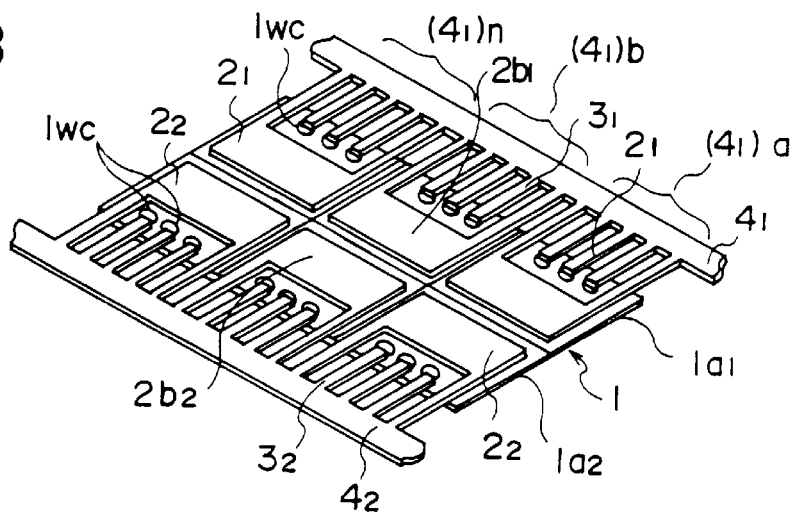

FIGS. 6A and 6B show a second embodiment of the present invention, wherein FIG. 6A shows the top side of a half-product obtained by the second embodiment in a perspective view, while FIG. 6B shows the bottom side of the half-product also in a perspective view.

Referring to FIGS. 6A and 6B, the master print circuit board 1 is now defined with print circuit regions $1a_1$–$1n_1$ and $1a_2$–$1n_2$, wherein the regions $1a_1$–$1n_1$ and $1a_2$–$1n_2$ are arranged in two rows.

At the side of the row including the regions $1a_1$–$1n_1$, a first lead frame structure $4_1$ is attached, wherein the lead frame structure $4_1$ includes lead frame regions $(4_1)a$–$(4_1)n$ respectively corresponding to the regions $1a_1$–$1n_1$. Each of the lead frame regions $(4_1)a$–$(4_1)n$ in turn includes a plurality of interconnection leads $3_1$, and the lead frame $4_1$ is connected electrically as well as mechanically to the master print circuit board 1 by soldering each of the interconnection leads $3_1$ to a corresponding electrode pad 1wc formed on bottom side of the master print circuit board 1. In FIG. 6A, the illustrations of the wiring patterns as well as the electronic components are omitted for the sake of simplicity of the drawing.

Similarly, another lead frame $4_2$ including lead frame regions $(4_2)a$–$(4_2)n$ is provided in electrical as well as mechanical connection with the print circuit regions $1a_2$–$1n_2$ forming another row on the master print circuit board 1. It should be noted that each of the lead frame regions $(4_2)a$–$(4_2)n$ includes interconnection leads $3_2$ extending therefrom as a part of the lead frame $4_2$, wherein the connection of the lead frame $4_2$ upon the master print circuit board 1 is achieved by soldering the interconnection leads $3_2$ to corresponding electrode pads 1wc formed on bottom side of the master print circuit board 1 in correspondence to the regions $1a_2$–$1n_2$.

After the half-product shown in FIGS. 6A and 6B is obtained, the master print circuit board 1 is subjected to a dicing process along V-shaped grooves indicated in FIG. 6A by a broken line. Alternatively, the dicing may be achieved by a laser sawing machine.

According to the construction of FIGS. 6A and 6B, the efficiency of production is increased significantly as compared with the case of the first embodiment.

Figure 7A:
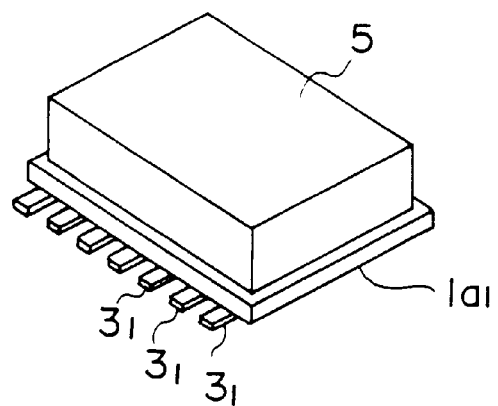
FIGS. 7A and 7B are diagrams showing the final product obtained by any of the first and second embodiments of the present invention.
Figure 7B:
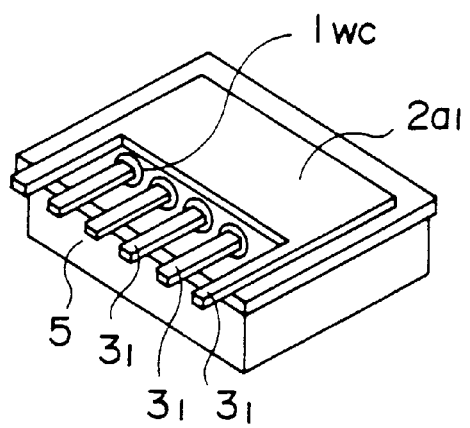

FIGS. 7A and 7B show the construction of an electronic apparatus obtained from the half-product of FIGS. 6A and 6B, by dicing the master print circuit board 1 and further by cutting the lead frame such that the interconnection leads 3 or $3_1$, $3_2$ are disconnected from the lead frame 4, $4_1$ or $4_2$.

Referring to the drawings, the illustrated electronic apparatus is the one formed on a print circuit board corresponding to the region $1a_1$, wherein the print circuit board of the illustrated apparatus is obtained by dicing the master print circuit board 1. Further, the print circuit board $1a_1$ carries the heat sink plate $2a_1$ on the bottom side thereof and a conductive cap 5 on the top side such that the cap 5 achieves an electrical interconnection with the heat sink plate $2a_1$ on the bottom side of the printed circuit board $1a_1$ via a contact hole (not illustrated) formed in the print circuit board $1a_1$. Thereby, the electronic components on the print circuit board $1a_1$ are shielded from electromagnetic interference.

Next, a description will be made about the step S6 of the flowchart of FIG. 4 for testing the electronic apparatuses produced by the present invention. The test is conducted upon a test rig that is designed particularly for testing the individual apparatuses in the state of the half-product described with reference to the first or second embodiment of the present invention.

Figure 8:
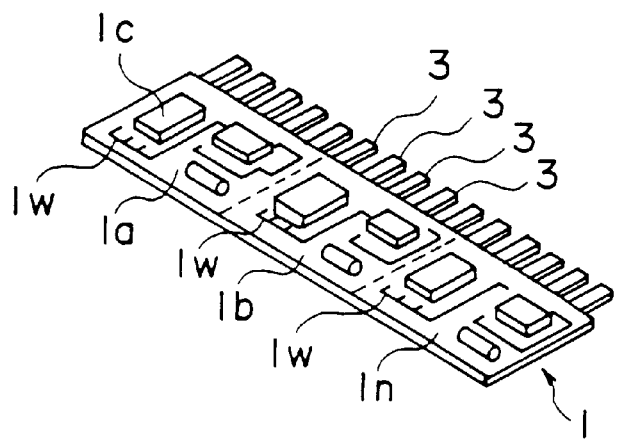
FIG. 8 is a diagram showing the half-product of a circuit ready for testing.

FIG. 8 shows half-product ready for testing in the test rig, wherein it will be noted that the interconnection leads 3 are disconnected from the lead frame 4. On the other hand, the print circuit regions $1a-1n$ are still in the state that they are connected with each other in the form of the master print circuit board 1.

In the half-product of FIG. 8, the circuits on the regions $1a-1n$ function, in principle, independently from each other, while the operation of the circuits tends to be affected from each other via electromagnetic interference. Such an electromagnetic interference at the time of testing is particularly serious in the construction of FIG. 8 where the individual circuits are disposed adjacent with each other with minute separation. Thus, the test rig includes a removable electromagnetic shield that selectively covers the circuit that is subjected to the testing.

It should be noted that such an electromagnetic shielding is essential for the testing of microwave devices and circuits, in which the operational characteristics tend to change between the state where an electromagnetic shielding is provided and the state where no such electromagnetic shielding is provided.

Thus, the test rig carries out the testing in the state that the circuit is shielded by a dummy metal cap that has the same size as the metal cap used in the actual device for electromagnetic shielding.

Figure 9:
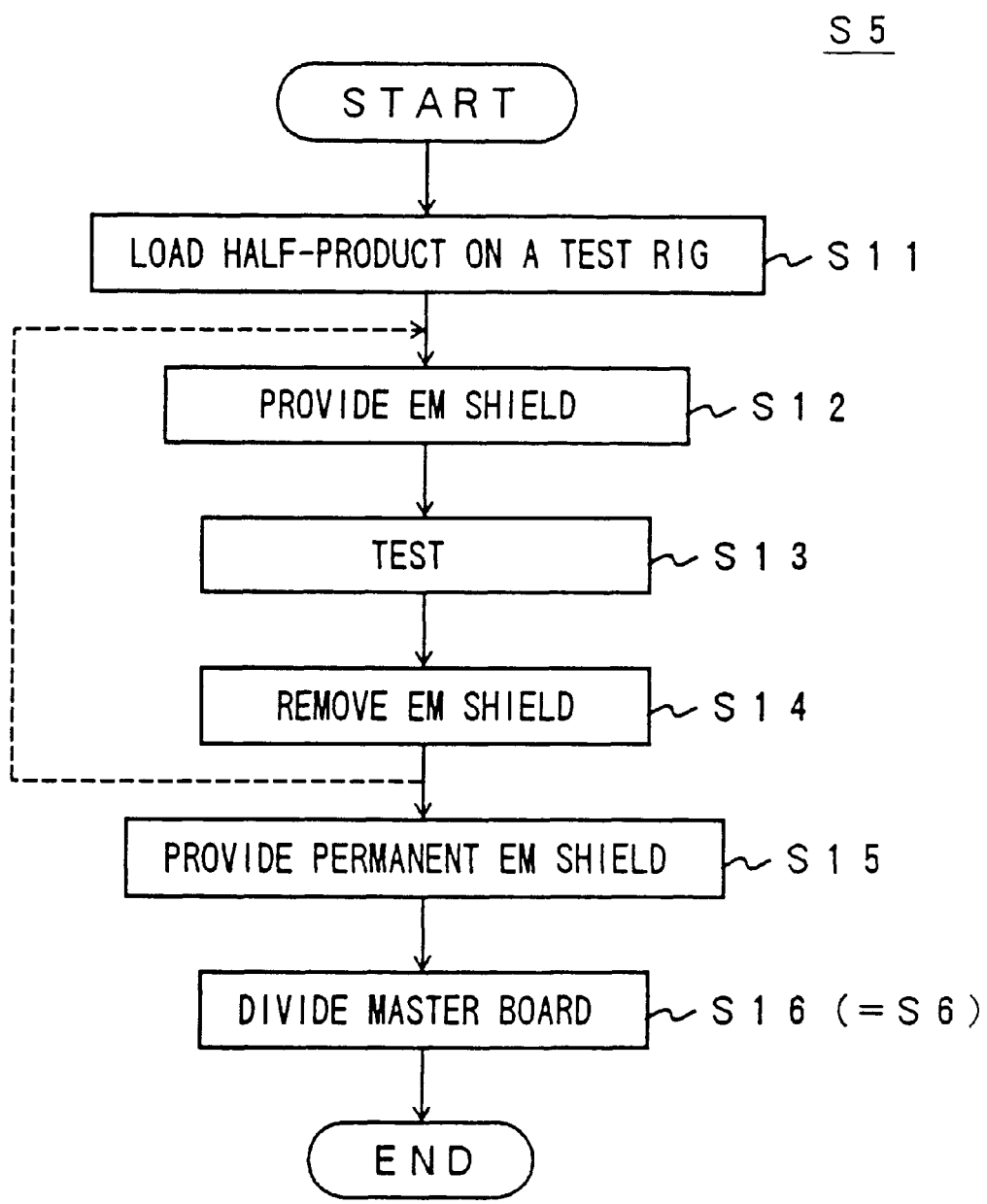
FIG. 9 is a flowchart showing the process of testing.

FIG. 9 is a flowchart showing the procedure of testing according to the present embodiment of the invention. It should be noted that the testing process of FIG. 9 corresponds to the step S5 of FIG. 4.

Referring to FIG. 9, the step starts with a step S11 for loading the half-product of FIG. 8 upon the test rig.

Next, in a step S12, an electromagnetic shielding is applied upon a selected print circuit on the master print circuit board 1, and a test is conducted upon the shielded print circuit in a step S13. After the testing in the step S13, the electromagnetic shielding is removed in a step S14, and the electromagnetic shielding is provided upon another print circuit on the board 1 by returning to the step S12. In this case, the steps S12 and S13 are repeated until all of the print circuits on the master print circuit board 1 are tested one by one.

Alternatively, In the step S12, the shielding may be provided upon all of the print circuits $1a-1n$ on the print circuit board 1. In this case, the testing in the step S13 may be conducted simultaneously.

After the testing is completed, the electromagnetic shielding of the test rig is removed, and the print circuits on the master print circuit board 1 are provided with a permanent electromagnetic shield such as the case 5 shown in FIG. 7A, as indicated in a step S15.

Further, a step S16 corresponding to the step S6 of FIG. 4 is carried out, and the master print circuit board 1 is divided into a plurality of print circuit boards each carrying a print circuit that has already been tested.

As noted previously, it is desirable to form the electromagnetic shielding of the test rig, which is applied in the step of S12, to have the same size as the size of the permanent electromagnetic shielding 5 so as to ensure that the result of the test is valid for the actual apparatuses that are shipped to the customers.

Figure 10:
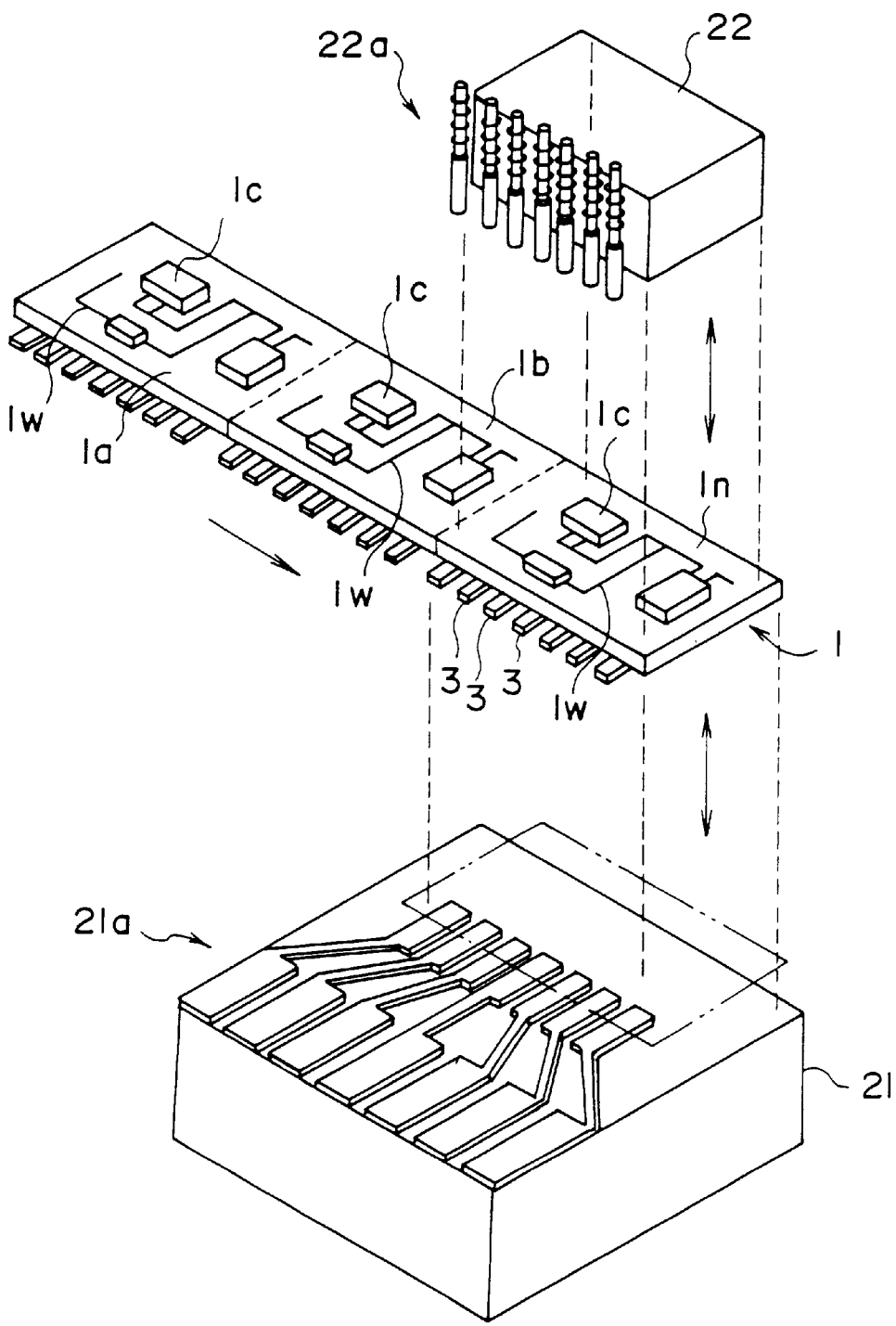
FIG. 10 is a diagram showing the construction of a test rig used for testing the apparatus in the state of half-product.

FIG. 10 shows the construction of a test rig 20 that includes a stage 21 on which the half-product shown in FIG. 8 is mounted during the test.

Referring to FIG. 10, the printed circuit board 1, forming the half-product and carrying various components $1c$ and conductor patterns $1w$ thereon on various print circuit regions $1a-1n$, is fed over the stage 21 by a feeding mechanism not illustrated, as indicated by an arrow.

The stage 21, in turn, carries a conductor pattern $21a$ for engagement with the interconnection leads 3 formed on the print circuit board 1, and the half-product thus formed in the form of the print circuit board 1 is fed to the test rig 20 such that the print circuit regions $1a-1n$ engage with the stage 21 consecutively one by one.

In order to shield each of the circuits on the regions $1a-1w$ during the testing, the test rig 20 includes a dummy metal cap 22 having a size and shape identical with a shield case that is actually provided on each of the product after the print circuit regions $1a-1n$ are divided into separate circuits. Further, in order to ensure proper engagement of the interconnection leads 3 with the corresponding conductor pattern $21a$, the metal cap 22 is equipped with pins $22a$ that are urged by respective coil springs for urging the interconnection leads 3 to the corresponding conductor pattern $21a$ on the stage 21. By using the metal cap 22, it is possible to test the apparatus in the condition identical to the condition in which the apparatus is used after shipping as a product.

FIG. 11 shows the construction of another test rig 30 that includes a stage 31 on which the half-product shown in FIGS. 6A and 6B is mounted.

Referring to FIG. 11, the print circuit board 1, forming the half-product and carrying various components $1c$ and conductor patterns $1w$ thereon on various regions $1a_1-1n_1$ and $1a_2-1n_2$, is fed over the stage 31 by a feed mechanism not illustrated as indicated by an arrow.

It should be noted that the print circuit board 1 carries the frames $4_1$ and $4_2$ at both lateral edges thereof, while the interconnection leads $3_1$ and $3_2$ are disconnected from the respective frames $4_1$ and $4_2$ for testing. Further, each of the frames $4_1$ and $4_2$ includes sprocket holes $4x$ for engagement with a sprocket of the feed mechanism not illustrated. Thereby, the lead frames $4_1$ and $4_2$ and hence the print circuit board 1, are fed stably in the direction indicated by an arrow.

The stage 31, in turn, includes stage regions 31A and 31B respectively carrying conductor patterns $31a$ and $31b$ for engagement with the interconnection leads $3_1$ and $3_2$ formed on a print circuit region on the print circuit board 1 such as the region $1n$, and the print circuit regions $1a_1-1n_1$ engage with the stage 31B consecutively one by one. Similarly, the print circuit regions $1a_2-1n_2$ engage with the stage 31A consecutively one by one.

In order to shield each of the circuits on the regions $1a_1-1n_1$ and $1a_2-1n_2$ during the test, the test rig 30 includes a dummy metal cap 32 formed of a first part 32A and a second part 32B, wherein each of the first and second parts 32A and 32B has a size and a shape identical with a shield case that is actually provided on each of the product after the print circuit regions $1a_1$–$1n_1$ and $1a_2$–$1n_2$ are divided into separate circuits. Further, in order to ensure proper engagement of the interconnection leads $3_1$ and $3_2$ with the corresponding conductor patterns 31*a* and 31*b*, the metal cap parts 32A and 32B are equipped with pins 32*a* and 32*b* that are urged by respective coil springs for urging the interconnection leads $3_1$ and $3_2$ to the corresponding conductor patterns 31*a* and 31*b* on the stage 31.

By using the test rig of FIG. 11, one can achieve the test of the apparatus efficiently in the same condition as the apparatus is used after shipping as a product.

Further, the present invention is not limited to the embodiments described heretofore, but various variations and modifications may be made without departing from the scope of the invention.

What is claimed is:

1. A method for testing a printed circuit formed on a common master printed circuit board including a plurality of printed circuits on respective printed circuit regions, said method comprising the steps of:

(a) providing a testing electromagnetic insulation upon said common master printed circuit board so as to cover a printed circuit thereon to be tested;

(b) carrying out a testing upon said printed circuit that is provided with said testing electromagnetic insulation;

(c) removing said testing electromagnetic insulation from said printed circuit after said step of testing;

(d) providing a permanent electromagnetic insulation upon said printed circuit, the permanent electromagnetic insulation having a size substantially identical to the testing electromagnetic insulation; and (e) dividing said common master printed circuit board into a plurality of printed circuit boards each carrying a printed circuit thereon.

2. A method as claimed in claim 1, wherein the testing electromagnetic insulation is provided upon all of said printed circuits on said common master print circuit board.

3. A method as in claim 1, wherein the testing electromagnetic insulation is provided simultaneously on all printed circuits on the common master printed circuit board.

4. A method as in claim 1, wherein all printed circuits on the common master printed circuit board are tested simultaneously.

5. A method as in claim 1, further comprising the following steps conducted after step (c) and before step (d):

(a1) providing the testing electromagnetic insulation on a printed circuit not yet tested;

(b1) carrying out a testing on the printed circuit not yet tested; and (c1) removing the testing electromagnetic insulation provided in step (a1).

6. A method as in claim 5, wherein steps (a1), (b1) and (c1) are repeated until all printed circuits are tested.

7. A method as in claim 5, wherein steps (a1), (b1) and (c1) are repeated such that the printed circuits are tested one by one.

8. A method as in claim 1, wherein the printed circuits are separately tested.

* * * * *